US008731210B2

(12) United States Patent
Cheng et al.

(10) Patent No.: US 8,731,210 B2
(45) Date of Patent: May 20, 2014

(54) AUDIO PROCESSING METHODS AND APPARATUSES UTILIZING THE SAME

(75) Inventors: Yiou-Wen Cheng, Taipei County (TW); Hsi-Wen Nien, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 1106 days.

(21) Appl. No.: 12/563,408

(22) Filed: Sep. 21, 2009

(65) Prior Publication Data

US 2011/0069846 A1 Mar. 24, 2011

(51) Int. Cl.
*H04R 1/02* (2006.01)
*H04R 29/00* (2006.01)
*H03G 3/00* (2006.01)

(52) U.S. Cl.
USPC .................................. 381/92; 381/56; 381/107

(58) Field of Classification Search
CPC ..... H03G 3/3052; H03G 9/025; H04R 3/005; H04R 2410/00; H04S 1/007
USPC ........... 381/92, 97–99, 107, 105, 56, 57, 313, 381/321
See application file for complete search history.

(56) References Cited

U.S. PATENT DOCUMENTS 7,113,604 B2 * 9/2006 Thompson ...................... 381/92
8,116,485 B2 * 2/2012 Escott et al. .................. 381/107

* cited by examiner

*Primary Examiner* — Vivian Chin
*Assistant Examiner* — Ammar Hamid
(74) *Attorney, Agent, or Firm* — McClure, Qualey & Rodack, LLP

(57) ABSTRACT

An audio processing apparatus is provided. A microphone array includes microphone units. Amplifier modules each receives and amplifies an input signal from one microphone unit to generate amplified signals. A compensation module receives adjusted gains corresponding to the amplifier modules, obtains a gain difference between the adjusted gains, and adjusts one amplified signal according to the gain difference to obtain a compensated signal.

21 Claims, 9 Drawing Sheets

AUDIO PROCESSING METHODS AND APPARATUSES UTILIZING THE SAME

BACKGROUND OF THE INVENTION

1. Field of the Invention

The invention relates to an audio processing apparatus, and more particularly, to an audio processing apparatus in a communication system with a microphone array.

2. Description of the Related Art

In a communication system, three components are picked up by a microphone or a microphone array, including: a source signal, interference and echo. The source signal is a desired signal, such as signals from voice, required to be sent to a far end side. Echo and interference are considered as objectionable components occurring in communication systems. The echo can be a result of a mismatch from a hybrid network, such as in the network echo case, or reflections caused by a reverberant environment, such as an acoustic echo. An echo can manifest from an originator in a speech signal, wherein the originator is able to hear his/her speech after a certain period of delay. With either kinds of echo, an annoyance factor increases as the amount of the delay increases.

Meanwhile, interference, such as environment noise, also disrupts the proper operation of various subsystems of a communications system, such as the codec. Different kinds of environment noise may vary widely in their characteristics, and a practical noise reduction scheme has to be capable of handling noises with different characteristics.

To properly remove the interference and echo picked up by the microphone array, a backend microphone array signal processing module plays an important role. For example, an adaptive beamforming filter is usually adopted in the signal processing module to beamform the source signal by suppressing the interference signal. An adaptive echo cancellation filter is also adopted to cancel the undesired echo. In addition, an automatic gain control (AGC) unit is further used in front of the signal processing module to adjust the input signal level to an appropriate level. However, as the gains of the AGC units in the microphone array diverge from one another, performance of the microphone array signal processing thereof degrades. Thus, a novel audio processing method and apparatus in a communication system with a microphone array are highly required.

BRIEF SUMMARY OF THE INVENTION

Audio processing apparatuses and audio processing methods are provided. An embodiment of an audio processing apparatus comprises a microphone array, a plurality of amplifier modules and a compensation module. The microphone array comprises a plurality of microphone units. Each of the amplifier modules receives and amplifies an input signal from one microphone unit to generate a plurality of amplified signals. The compensation module receives a plurality of adjusted gains corresponding to the amplifier modules, obtains a gain difference between the adjusted gains, and adjusts one amplified signal according to the gain difference to obtain a compensated signal.

An embodiment of an audio processing apparatus comprises a first microphone unit, a first programmable gain amplifier (PGA), a first automatic gain control (AGC) unit, a second microphone unit, a second PGA, a second AGC unit and a compensation module. The first PGA receives a first input signal picked up by the first microphone unit and amplifies the first input signal to generate a first amplified signal. The second PGA receives a second input signal picked up by the second microphone unit and amplifies the second input signal to generate a second amplified signal. The compensation module is coupled to the first and second AGC units, receives the first and second adjusted gains from the first and second AGC units, obtains a gain difference between the first and second adjusted gains, and suppresses one of the first and the second input signals or amplified signals in response to the gain difference to obtain a first compensated signal or a second compensated signal.

An embodiment of an audio processing method comprises: obtaining a gain difference between a first adjusted gain generated by a first automatic gain control (AGC) unit and a second adjusted gain generated by a second AGC unit, wherein the first AGC is arranged to adjust gain of a first programmable gain amplifier (PGA) amplifying signals picked up by a first microphone, and the second AGC is arranged to adjust gain of a second PGA amplifying signals picked up by a second microphone; suppressing a first signal originally generated by the first microphone by the gain difference when the first adjusted gain is greater than the second adjusted gain; and suppressing a second signal originally generated by the second microphone by the gain difference when the first adjusted gain is not greater than the second adjusted gain.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
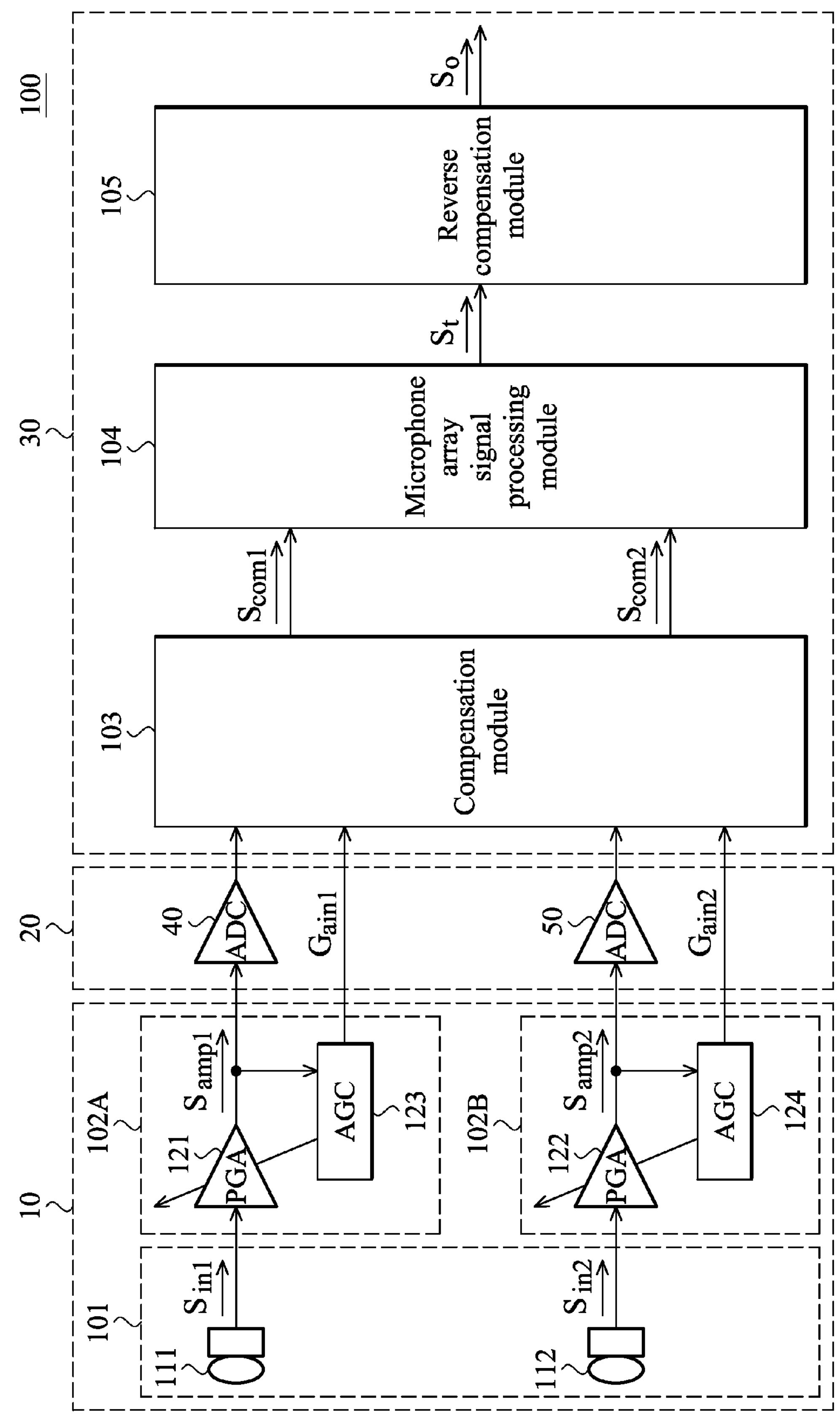
FIG. 1 shows an audio processing apparatus according to an embodiment of the invention.

FIG. 1 shows an audio processing apparatus in a system according to an embodiment of the invention. According to the embodiment of the invention, the system may be a mobile phone or a Bluetooth handset with a microphone module 10 mounted inside (or disposed outside) of the audio processing apparatus 100 to pick up audio signals. The microphone module 10 may be a hardware module and comprise a linear array of sensors, such as the microphone array 101, to pick up the audio signals. The microphone array 101 may comprise a plurality of microphone units (for example, the microphone units 111 and 112) to pick up the audio signals from different directions. The microphone module 10 may further comprise a plurality of amplifier modules 102A and 120B to enhance the input audio signals. The amplifier modules 102A and 120B receive the input signals from the microphone array 101 and respectively amplify the input signals in each audio processing path.

According to an embodiment of the invention, the amplifier modules 102A and 120B may comprise a plurality of Programmable Gain Amplifiers (PGA) (for example, PGAs 121 and 122) and their corresponding Automatic Gain Control (AGC) units (for example, AGC units 123 and 124). The PGAs 121 and 122 are electronic amplifiers, such as operational amplifiers, whose gains can be controlled by external signals, either digital or analog, issued by corresponding AGC units 123 and 124 respectively. The AGC units 123 and 124 are control circuits and well-known by those skilled in the art. Normally, the amplification of the PGAs 121 and 122 may be held or maintained at a predetermined level and the AGC units 123 and 124 do not operate. After detecting a clipping, the detected AGC unit 123 or 124 adjusts the corresponding gain of the PGA 121 or 122 by a certain level in dB. Specifically, the PGAs 121 and 122 respectively receive the input signals $S_{in1}$ and $S_{in2}$ from the microphone units 111 and 112 and amplify the input signals to generate the amplified signals $S_{amp1}$ and $S_{amp2}$. The amplified signals $S_{amp1}$ and $S_{amp2}$ may further be detected by the AGC units 123 and 124. The AGC units 123 and 124 adaptively adjust the gains of the PGAs 121 and 122 if clippings are detected to generate the adjusted gains (for example, Gain1 and Gain2 shown in FIG. 1). According to the embodiments of the invention, the AGC unit 123 or 124 may be activated, when detecting an amplitude of the corresponding amplified signal $S_{amp1}$ or $S_{amp2}$ is clipped, and adjust the gain of PGA 121 or 122 to a specific level denoted as Gain1 or Gain2. Note that clipping means that the signal level (i.e. amplitude) of the amplified signal $S_{amp1}$ and/or $S_{amp2}$ exceeds an appropriate signal level as defined by the AGC units 123 and 124.

According to the embodiment of the invention, the audio processing apparatus 100 may further comprise an analog to digital converting module 20 and a signal processing module 30. The analog to digital converting module 20 may comprise a plurality of analog to digital converters (for example, the ADCs 40 and 50). The amplified signals $S_{amp1}$ and $S_{amp2}$ may be converted by the ADCs 40 and 50 to digital domain for further signal processing. The signal processing module 30 may comprise a compensation module 103, a microphone array signal processing module 104 and a reverse compensation module 105. Note that the analog to digital converting module 20 may also be arranged inside of the signal processing module 30 and the invention should not be limited thereto. As an example, the digital converting module 20 may be disposed between the compensation module 103 and microphone array signal processing module 104. Therefore, the compensation module 103 may also compensate the amplified signals in the analog domain and the invention should not be limited thereto. Since the amplified signals may be compensated in either a digital or an analog format, in the remaining figures, details of the ADCs will be omitted for brevity.

According to the embodiments of the invention, the compensation module 103 may receive the input or amplified signals (either in a digital or an analog format) and adjusts (or compensates) gains of the input or amplified signals according to the difference between gains previously adjusted by AGC units 123 and 124 to obtain a plurality of compensated signals (for example, compensated signals $S_{com1}$ and $S_{com2}$). The microphone array signal processing module 104 may process the compensated signals to obtain a target signal $S_t$. Generally, the audio signal picked up from noisy channels may comprise at least one of a source signal and interference, where the source signal is the desired signal, such as voice of a human and the interference refers to all the environment or background noise. According to an embodiment of the invention, the microphone array signal processing module 104 may be implemented to filter out the interference portion, and output the target signal approximating the desired source signal portion. As an example, the microphone array signal processing module 104 may comprise an adaptive beamforming filter (ABF) and an adaptive echo canceller (AEC) to filter out the undesired interference and the echo. Finally, the reverse compensation module 105 may reversely adjust gain of the target signal $S_t$ according to the gain difference to generate an output signal $S_o$.

Figure 2:
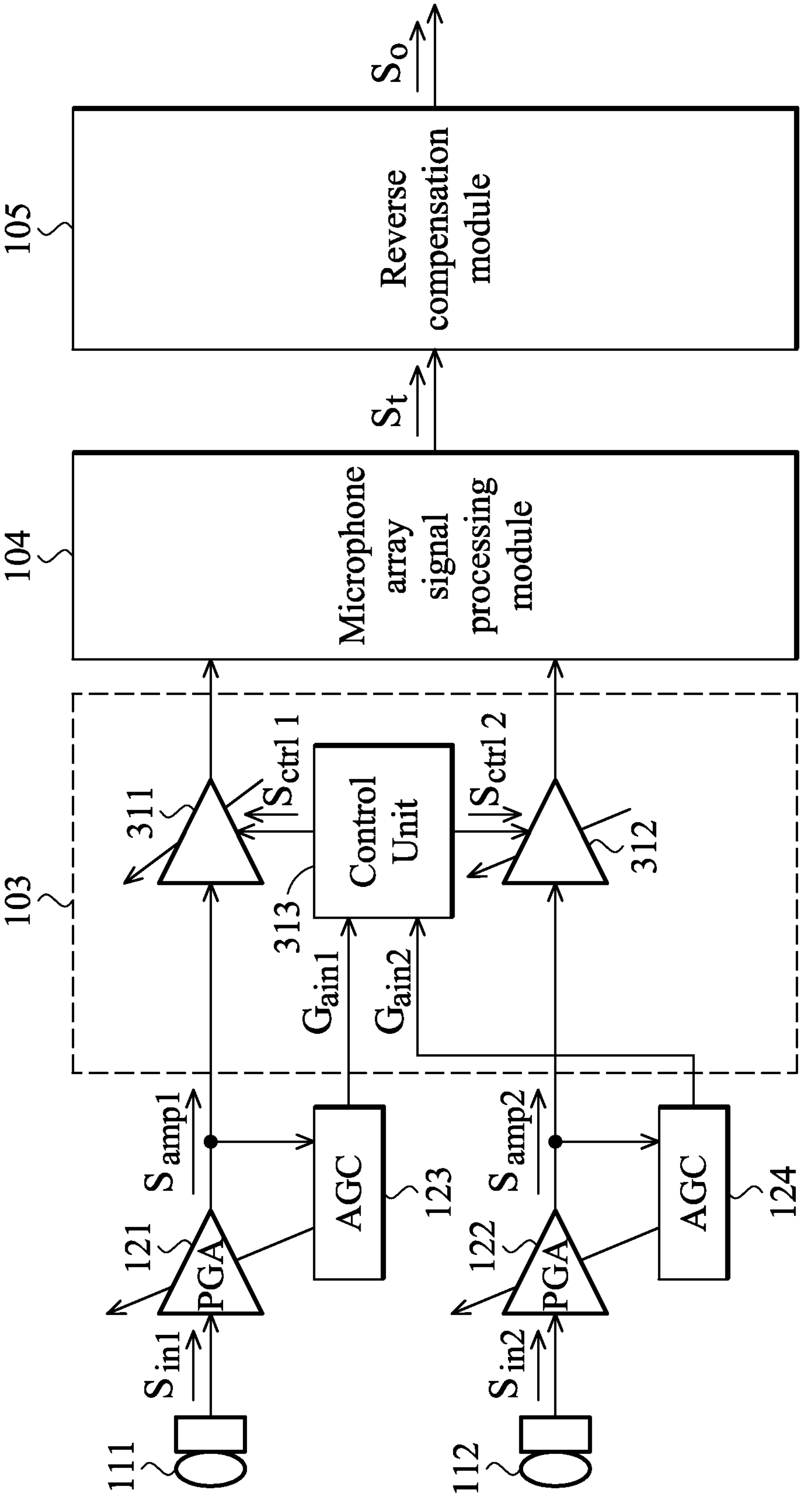
FIG. 2 shows an exemplary audio processing apparatus according to an embodiment of the invention.

FIG. 2 shows an exemplary audio processing apparatus according to an embodiment of the invention. According to the embodiment of the invention, the compensation module 103 may comprise a plurality of compensation units (for example, the compensation units 311 and 312) and a control unit 313. Each of the compensation units 311 and 312 receives the amplified signal (either in a digital or an analog format) from a corresponding PGA continuously. In an embodiment, the gain of one compensation unit may be adjusted by a control signal (for example, the control signals $S_{cntl1}$ and $S_{cntl2}$) at one time or in a specific time period in response to the difference between gains previously adjusted by AGC units 123 and 124. The compensation units 311 and 312 may be implemented in PGAs or similar amplifiers. The control unit 313 may detect the difference between the gains adjusted by the AGC units 123 and 124 and generate the control signals $S_{ctrl1}$ and $S_{ctrl2}$ according to the gain difference. Note that the reason for adjusting the gains of the amplified signals is because independent activation of AGC units in different audio processing paths may degrade the overall performance of the microphone array signal processing. Some examples of the degradation will be explained in following paragraphs.

Figure 3:
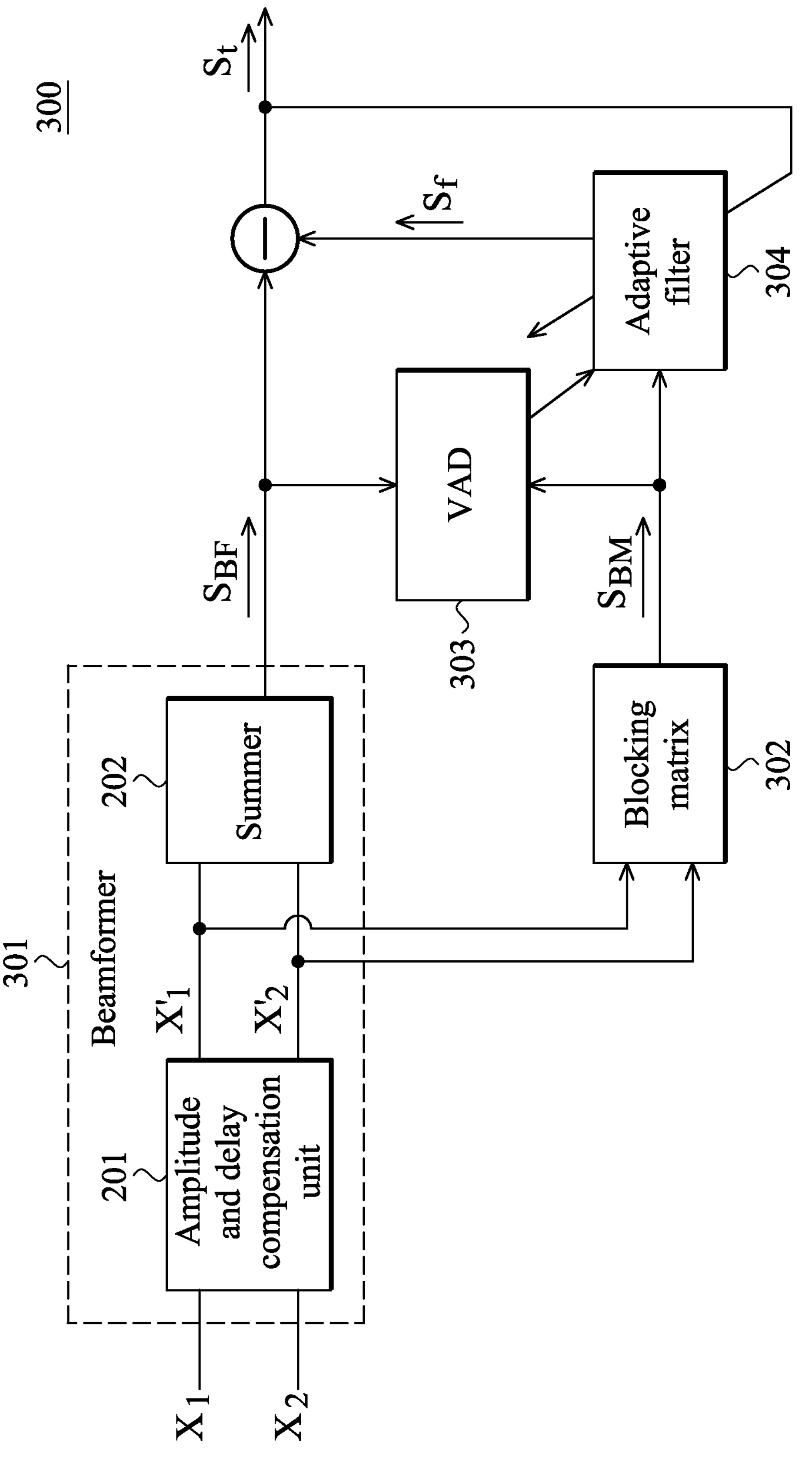
FIG. 3 shows an adaptive beamforming filter according to an embodiment of the invention.

According to an embodiment of invention, the microphone array signal processing module 104 may be implemented in an adaptive beamforming filter. FIG. 3 shows an adaptive beamforming filter 300 according to an embodiment of the invention. According to the embodiment of invention, the ABF 300 may be one of the microphone array signal processing devices implemented in the microphone array signal processing module 104, and comprise a beamformer 301, a blocking matrix 302, a Voice Activity Detector (VAD) 303 and an adaptive filter 304. The beamformer 301 may receive the input signals $X_1$ and $X_2$ from different audio processing paths and process the input signals to generate a processed signal $S_{BF}$. According to an embodiment of the invention, the beamformer 301 may be implemented as a delay-and-sum beamformer with an amplitude and delay compensation unit 201 and a summer 202. The amplitude and delay compensation unit 201 compensates the amplitude difference and time delays of the input signals picked up by different microphone units so as to synchronize the desired source signal portion of the input signals. The amount of compensations may be obtained by calibration in advance according to the attributes of the microphone array. The summer 202 coherently adds the desired source signal portions of the input signals and incoherently adds the interference portions. Therefore, strength of the desired source signal is theoretically enhanced. The blocking matrix 302 may receive the synchronized signals $X'_1$ and $X'_2$ and operate to cancel the desired source signal portion from the input signals so as to generate another processed signal $S_{BM}$. According to an embodiment of the invention, the blocking matrix 302 may cancel the desired source signal by subtraction.

Suppose that the input signals $X_1$ and $X_2$ are expressed by:

$$X_1(n)=S_1(n)*h_{11}(n)S_2(n)*h_{21}(n) \quad \text{Eq.1,}$$

$$X_2(n)=S_1(n)*h_{12}(n)S_2(n)*h_{22}(n), \quad \text{Eq.2}$$

where $S_1(n)$ represents the desired source signal and $S_2(n)$ represents the interference signal, and $h_{ij}(n)$ represents the channel impulse response corresponding to the j-th microphone unit and experienced by the signal Si(n), i=1 or 2 and j=1 or 2. Therefore, the processed signal $S_{BM}$ output from the blocking matrix 302 may be obtained by:

$$S_{BM}(n)=X'_1(n)-X'_2(n) \quad \text{Eq. 3.}$$

Based on adequate compensation in the amplitude and delay compensation unit 201, the impulse response $h_{11}(n)$ may theoretically equal $h_{12}(n)$. Thus, the processed signal $S_{BM}$ may be obtained as:

$$S_{BM}(n)\rightarrow S_2(n)*(h_{21}(n)-h_{22}(n)) \quad \text{Eq.4}$$

The adaptive filter 304 generates a filtered signal $S_f$ approximating the interference by adaptively filtering the processed signals $S_{BM}$. By subtracting the filtered signal $S_f$ from the processed signal $S_{BF}$, a target signal $S_t$ approximating the desired source signal may be obtained. In addition, the VAD 303 may further be introduced to detect the existence of the desired source signal, and control the adaptation steps of the adaptive filter 304 so as to improve the adaptation performance.

Figure 4:
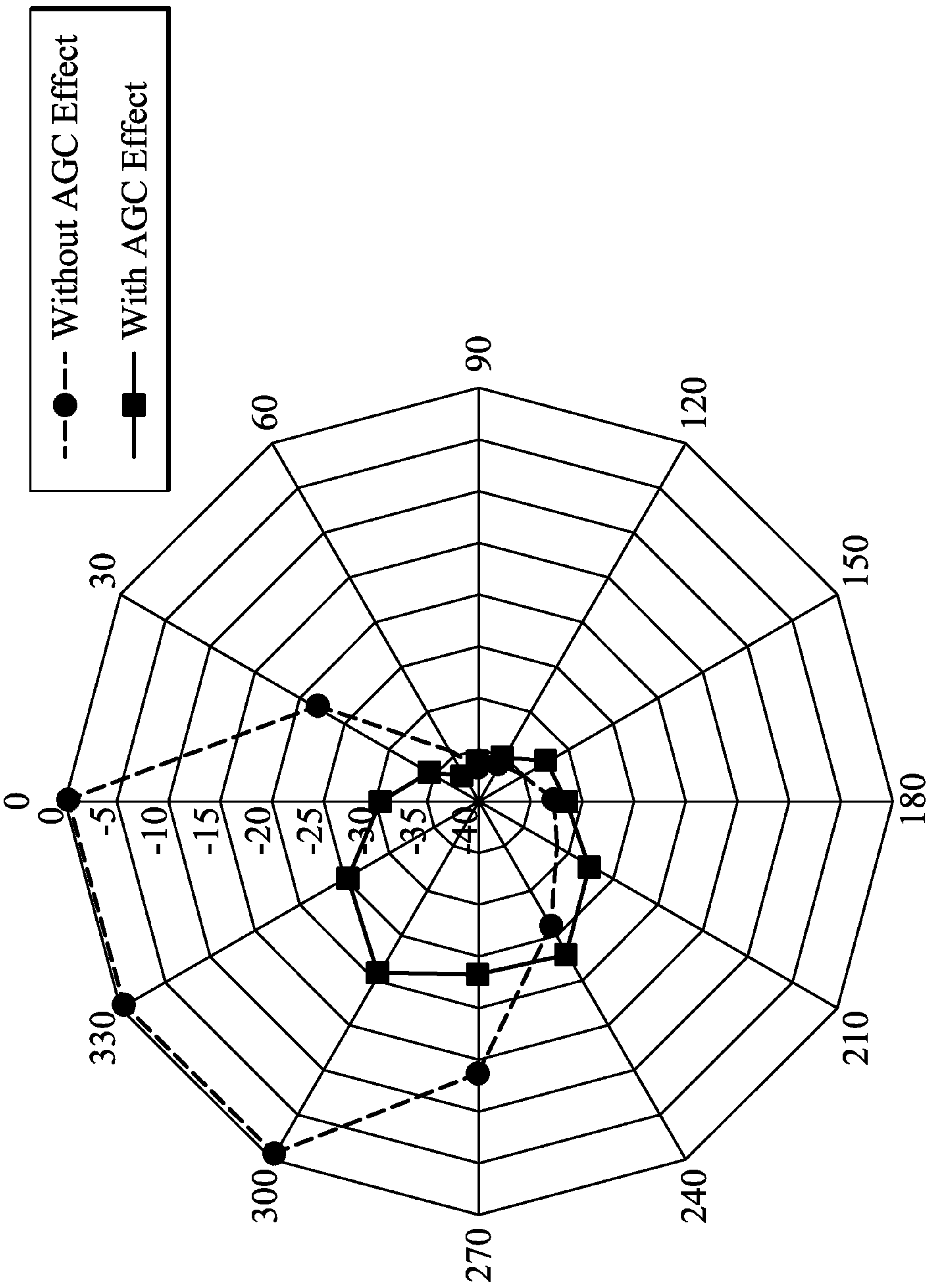
FIG. 4 shows a polar pattern of the adaptive beamforming filter output signal according to an embodiment of the invention.

However, independently activated AGC units in different audio processing paths may unintentionally destroy the predetermined amplitude difference relationship between the input signals $S_{in1}$ and $S_{in2}$ (as shown in FIG. 1 or 2), which is an important compensation parameter referenced by the amplitude and delay compensation unit 201. Once the predetermined relationship is destroyed, the beamformer 301 may not be able to coherently add the desired source signals, and the blocking matrix 302 may not be able to cancel the desired source signals. The situation is even worse for the VAD 303, which may erroneously detect the existence of the desired source signal. FIG. 4 shows a polar pattern of the adaptive beamforming filter output signal according to an embodiment of the invention. As shown in FIG. 4, the AGC effect seriously degrades the beamforming performance of the output signal, resulting in erroneous cancellation of the desired source signal.

Figure 5:
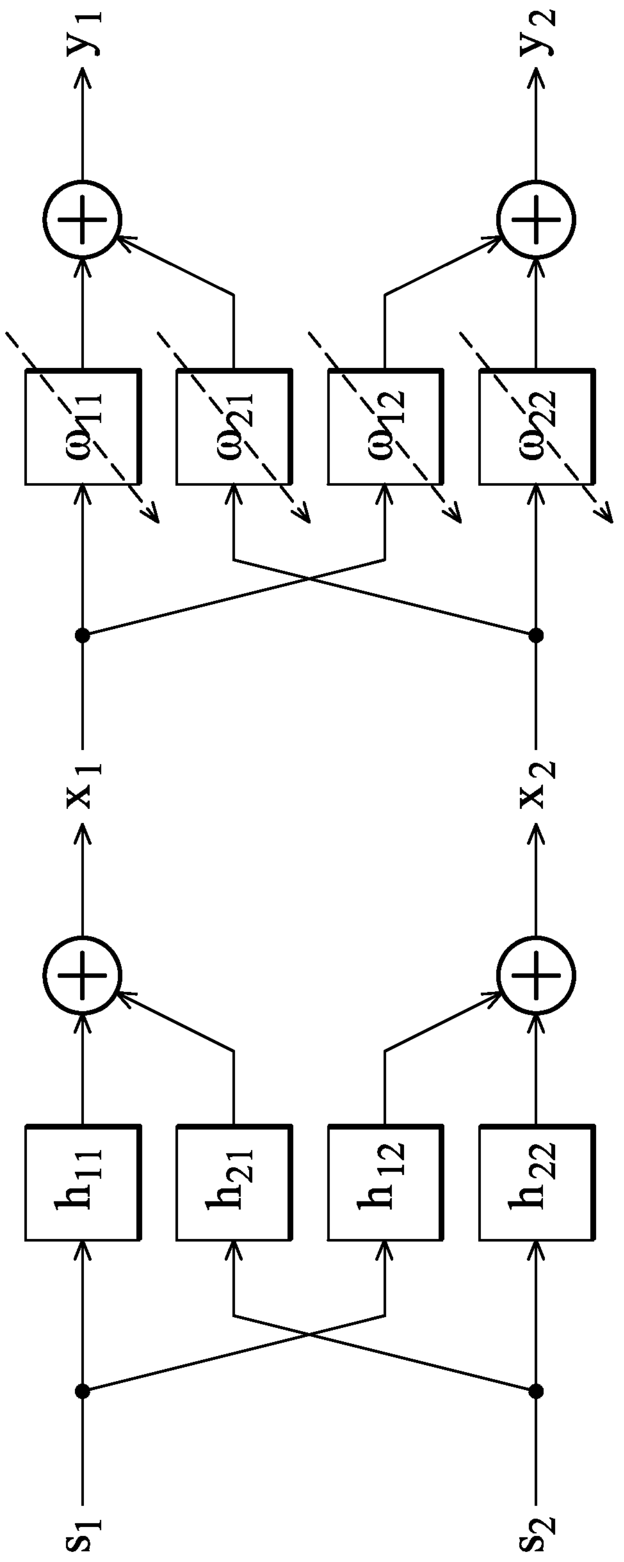
FIG. 5 shows a blind source separation model according to an embodiment of the invention.

According to another embodiment of invention, the microphone array signal processing module 104 may be implemented in a blind source separation model. FIG. 5 shows a blind source separation model according to an embodiment of the invention. According to the embodiment of invention, blind source separation may also be implemented in the microphone array signal processing module 104 (as shown in FIG. 1 or 2) so as to separate the desired source signal from a set of mixed input signals. Blind source separation separates a set of signals into a set of other signals by minimizing the correlation between the output signals $y_1$ and $y_2$. Several times of iterations may be required to determine the best filter coefficients $W_{ij}(n)$ corresponding to the j-th microphone unit and the signal Si(n). However, when the AGC units are independently activated, it is difficult for the algorithm output to converge due to severe gain fluctuations. Therefore, in order to mitigate the AGC effect while maintaining good signal quality, an appropriate compensation scheme as previously illustrated is highly desired.

Referring back to FIG. 2, according to an embodiment of the invention, the compensation module 103 may detect the difference between gains adjusted by the AGC units 123 and 124 and suppress the amplified signal of one path $S_{amp1}$ or $S_{amp2}$, or suppress the input signal of one path $S_{in1}$ or $S_{in2}$ according to the gain difference. As an example, when the adjusted gain Gain1 (for example, 6 dB) generated by the AGC 123 is greater than the adjusted gain Gain2 (for example, 0 dB) generated by the AGC 124, the compensation module 103 may compensate the amplified signal $S_{amp1}$ by a level (for example, −6 dB) to maintain the preset relationship between the input signals $S_{in1}$ and $S_{in2}$. As another example, when the adjusted gain Gain2 (for example, 6 dB) generated by the AGC 124 is greater than the adjusted gain Gain1 (for example, 0 dB) generated by the AGC 123, in order to maintain the preset relationship between the input signals, the compensation module 103 may compensate the amplified signal $S_{amp2}$ by a level (for example, −6 dB).

Figure 6:
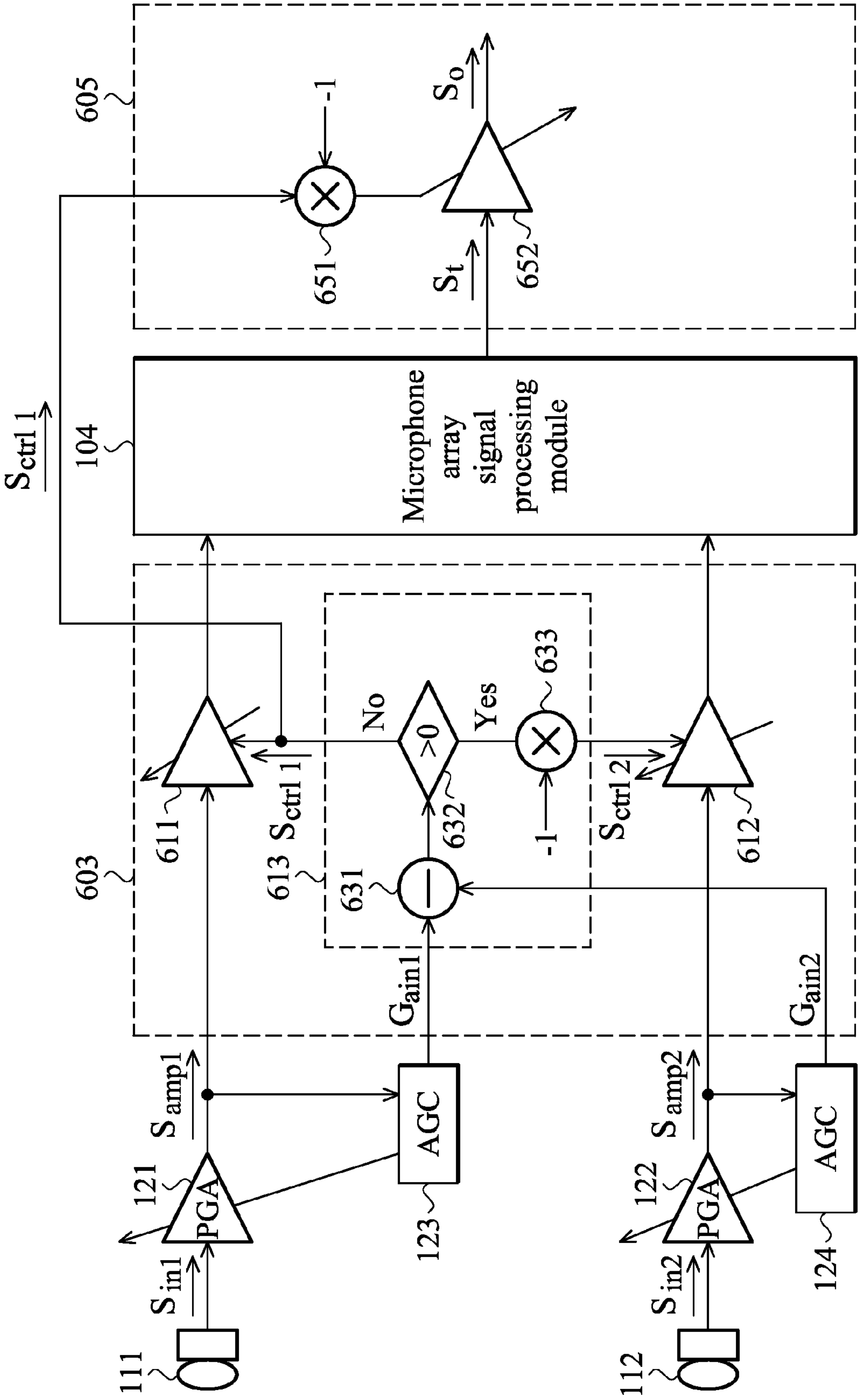
FIG. 6 shows an exemplary audio processing apparatus according to an embodiment of the invention.

FIG. 6 shows an exemplary audio processing apparatus according to an embodiment of the invention. According to the embodiment of the invention, the compensation module 603 may comprise compensation units 611 and 612 and a control unit 613. The compensation unit 611 receives and compensates amplified signal $S_{amp1}$ or the input signal $S_{in1}$ (either in a digital or an analog format) according to a control signal $S_{cntl1}$. The compensation unit 612 receives and compensates amplified signal $S_{amp2}$ or the input signal $S_{in2}$ (either in a digital or an analog format) according to a control signal $S_{ctrl2}$. The compensation units 611 and 612 may be implemented in PGAs or similar amplifiers. The control unit 613 detects the difference between the gains Gain1 and Gain 2 adjusted by the AGC units 123 and 124 and generates and issues the control signal $S_{ctrl1}$ or $S_{ctrl2}$ to the compensation unit 611 or 612 according to the gain difference.

According to an embodiment of the invention, the control unit 613 may subtract a value of Gain1 from a value of Gain2 via a subtraction unit 631 to obtain the gain difference (Gain2−Gain1). A decision device 632 determines whether the obtained gain difference is a positive value. When the obtained gain difference is not a positive value, the gain difference is passed to the compensation unit 611 so as to accordingly suppress the amplified signal $S_{amp1}$ or the input signal $S_{in1}$ by the gain difference. On the other hand, when the obtained gain difference is a positive value, the obtained gain difference is inverted by multiplying (−1) via the multiplier 633 and passed to the compensation unit 612 to accordingly suppress the amplified signal $S_{amp2}$ or the input signal $S_{in2}$ by the gain difference. As an example, when the obtained gain difference is −6 dB, the compensation unit 611 may suppress the amplified signal $S_{amp1}$ or the input signal $S_{in2}$ by 6 dB. On the other hand, when the obtained gain difference is +6 dB, the compensation unit 612 may suppress the amplified signal $S_{amp2}$ or the input signal $S_{in2}$ by 6 dB.

According to the embodiment of the invention, when one microphone unit is implemented as a main microphone to pick up the source signal from the desired direction, it may reversely adjust the gain of the target signal according to the gain difference adjusted by the AGCs when the amplified signal corresponding to the main microphone has been suppressed by the compensation module. As shown in FIG. 6, the control signal $S_{ctrl1}$ may further be fed to the reverse compensation module 605 when the microphone unit 111 is implemented as a main microphone of the system. When the amplified signal $S_{amp1}$ corresponding to the main microphone has been suppressed by the compensation module 603, the gain of the target signal $S_t$ may further be amplified according to the gain difference. As an example, the control signal $S_{ctrl1}$ may be inversed by multiplying (−1) via the multiplier 651 and fed to the compensation unit 652 so as to amplify the target signal $S_t$ by the previously compensated gain difference to obtain the output signal $S_o$.

As one of ordinary skill in the art will readily appreciate, the compensation module and reverse compensation module as illustrated above may be implemented in any similar but different logical circuits or firmware/software modules executed by a microcontroller unit (MCU) or a digital signal processor (DSP), or the combinations thereof, to perform substantially the same function and achieve substantially the same result. While the invention has been described by way of example and in terms of preferred embodiment, it is to be understood that the invention is not limited thereto.

Figure 7:
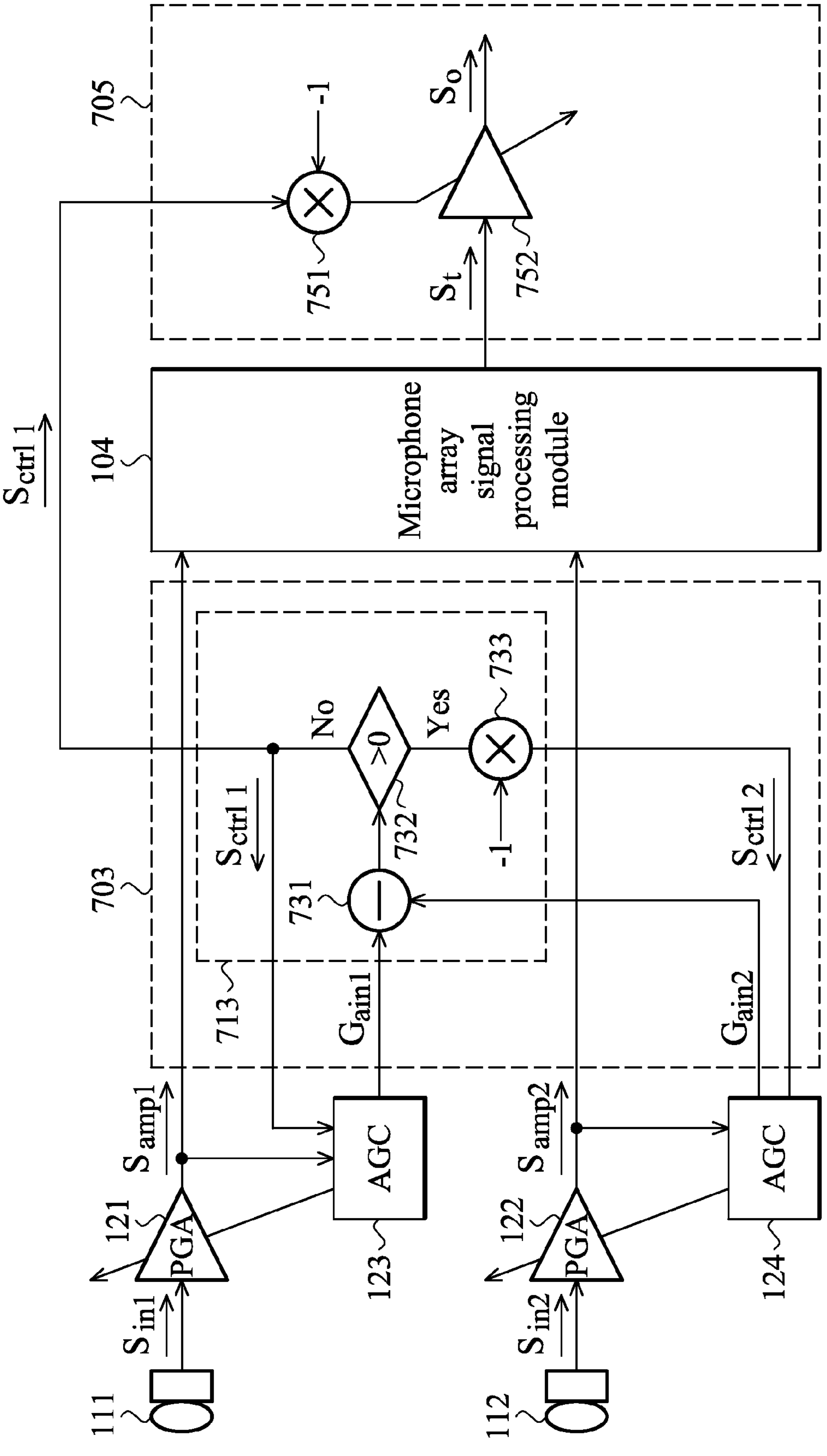
FIG. 7 shows an exemplary audio processing apparatus according to another embodiment of the invention.

FIG. 7 shows an exemplary audio processing apparatus according to another embodiment of the invention. According to the embodiment of the invention, the compensation module 703 may comprise a control unit 713. The control unit 713 detects the difference between gains Gain1 and Gain2 adjusted by the AGC units 123 and 124 and generates and issues the control signal $S_{ctrl1}$ or $S_{ctrl2}$ to the AGC unit 123 or 124 according to the gain difference. In the embodiments of invention, gain compensations may be performed by the AGC units 123 and 124. As an example, the AGC units 123 and 124 may respectively receive the control signals $S_{ctrl1}$ and $S_{ctrl2}$ from the control unit 713, and adjust the gains of the PGAs 121 and 122 according to the control signals $S_{ctrl1}$ and $S_{ctrl2}$. The control unit 713 may subtract a value of the Gain1 from a value of Gain2 via a subtraction unit 731 to obtain the gain difference (Gain2−Gain1). A decision device 732 determines whether the obtained gain difference is a positive value. When the obtained gain difference is not a positive value, the gain difference is passed to the AGC unit 123 so as to accordingly suppress the amplified signal $S_{amp1}$ by the gain difference. On the other hand, when the obtained gain difference is a positive value, the obtained gain difference is inverted by multiplying (−1) via the multiplier 733 and passed to the AGC unit 124 so as to accordingly suppress the amplified signal $S_{amp2}$ by the gain difference. It is to be understood that the AGC 123 or 124 adjusts the gain of PGA 121 or 122 with reference to not only the clipping extent of the amplified signal $S_{amp1}$ or $S_{amp2}$ but also the control signal $S_{ctrl1}$ or $S_{ctrl2}$ from the control unit 713. As an example, when the obtained gain difference is −6 dB, the AGC unit 123 may further suppress the amplified signal $S_{amp1}$ by 6 dB. On the other hand, when the obtained gain difference is +6 dB, the AGC unit 124 may further suppress the amplified signal $S_{amp2}$ by 6 dB. Note that in the embodiment, the PGAs may generate the amplified signals with the compensation by the control unit 713.

As previously illustrated, when one microphone unit is implemented as a main microphone to pick up the source signal from the desired direction, it may reversely adjust the gain of the target signal according to the difference of the gains adjusted by the AGCs when the amplified signal corresponding to the main microphone has been suppressed by the compensation module. As shown in FIG. 7, the control signal $S_{ctrl1}$ may further be fed to the reverse compensation module 705 when the microphone unit 111 is implemented as a main microphone of the system. When the amplified signal $S_{amp1}$ corresponding to the main microphone has been suppressed by the compensation module 703, the target signal $S_t$ may further be amplified according to the gain difference. As an example, the control signal $S_{ctrl1}$ may be inversed by multiplying (−1) via the multiplier 751 and fed to the compensation unit 752 so as to amplify the target signal $S_t$ by the previously compensated gain difference to obtain the output signal $S_o$.

As one of ordinary skill in the art will readily appreciate, the compensation module and reverse compensation module as illustrated above may also be implemented by any similar but different logical circuits or firmware/software modules executed by a MCU or a DSP to perform substantially the same function and achieve substantially the same result. While the invention has been described by way of example and in terms of preferred embodiment, it is to be understood that the invention is not limited thereto.

Figure 8:
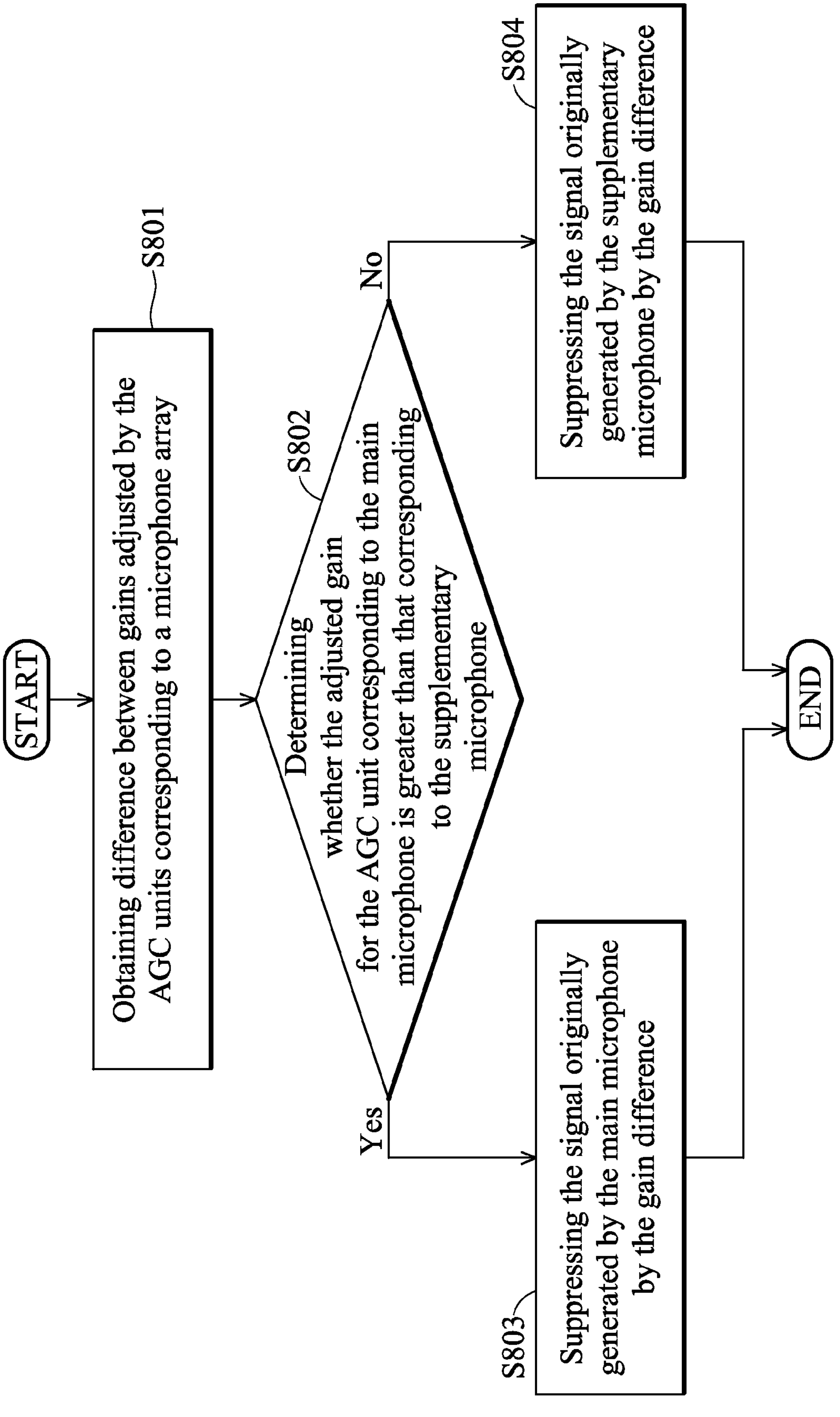
FIG. 8 shows a flow chart of an audio processing method according to an embodiment of the invention.

FIG. 8 shows a flow chart of an audio processing method according to an embodiment of the invention, performed by the control unit 313 (as shown in FIG. 3), 613 (as shown in FIG. 6) or 713 (as shown in FIG. 7) when executing program codes or instructions. A microphone array may contain a main microphone and a supplementary microphone (e.g. microphones 111 and 112 of FIG. 2, 6 or 7) for collecting audio signals from different directions, where the main microphone may be arranged in the lower side of a front panel of a mobile phone to pick up clear speech signals from a human and the supplementary microphone may be arranged in the upper side of a back panel of the mobile phone to pick up environmental noise. Two AGC units (e.g. AGC units 123 and 124 of FIG. 2, 6 or 7) are provided to adjust gains of PGAs corresponding to the main and supplementary microphones, and each AGC unit adjusts the gain of the corresponding PGA when a clipping is occurred in a signal amplified by the PGA. After receiving gains adjusted by the AGC units corresponding to a microphone array, the difference therebetween ($Diff_{Gain}$=|Gain1−Gain2|) is obtained (Step S801). It is determined whether the adjusted gain for the AGC unit corresponding to the main microphone is greater than that corresponding to the supplementary microphone (Step S802). If so, the signal originally generated by the main microphone is suppressed by the gain difference $Diff_{Gain}$ (Step S803). In an embodiment, the signal may be suppressed via a compensation unit coupled subsequently to the corresponding PGA (e.g. compensation unit 312 or 612 of FIG. 2 or 6). In another embodiment, the signal may be suppressed via the AGC unit (e.g. 123 of FIG. 7) corresponding to the main microphone. Otherwise, the signal originally generated by the supplementary microphone is suppressed by the gain difference $Diff_{Gain}$ (Step S803). It is to be understood that, if the gain difference is zero, the signal amplified by the PGA corresponding to the main microphone may not be adjusted. In an embodiment, the signal may be suppressed via a compensation unit coupled subsequently to the corresponding PGA (e.g. compensation unit 311 or 611 of FIG. 2 or 6). In another embodiment, the signal may be suppressed via the AGC unit (e.g. 124 of FIG. 7) corresponding to the supplementary microphone.

Figure 9:
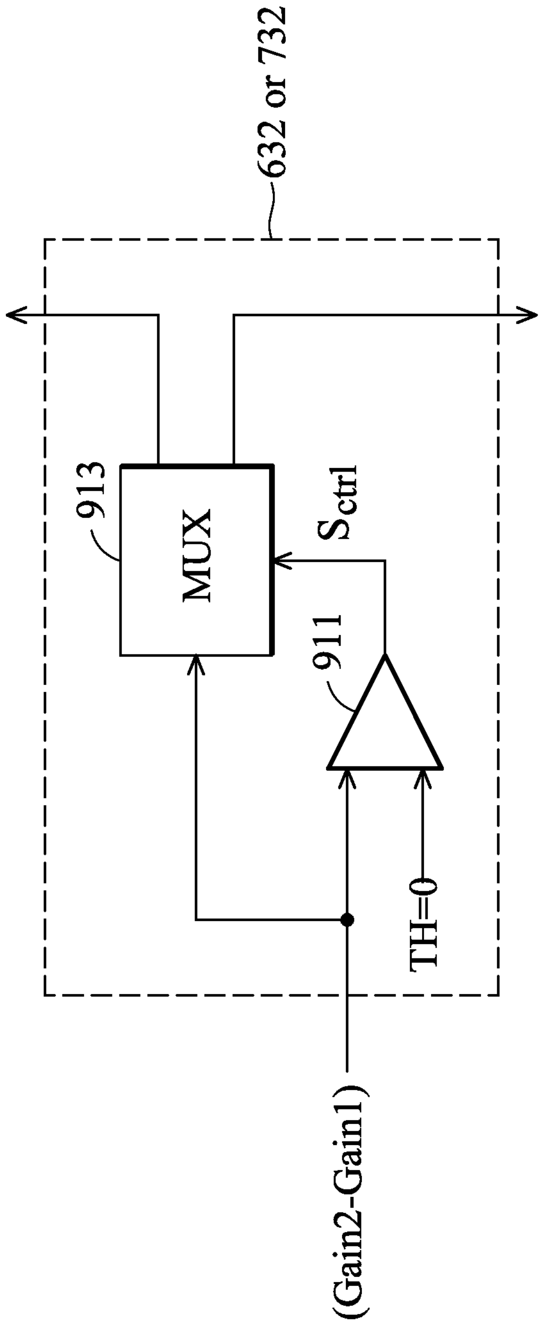
FIG. 9 shows an exemplary decision device according to an embodiment of the invention.

FIG. 9 shows an exemplary decision device 632 or 732 according to an embodiment of the invention. A comparator 911 is configured to compare a received gain difference (Gain2−Gain1) from the subtraction unit 631 or 731 with a threshold zero to generate a control signal $S_{ctrl}$ to control a MUX 913. When the gain difference is greater than zero, the MUX 913 is controlled by the control signal $S_{ctrl}$ to pass the gain difference to the multiplier 633 or 733, otherwise, to the compensation unit 611 or the AGC units 123 and the multiplier 751.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An audio processing apparatus, comprising:

a microphone array, comprising a plurality of microphone units;

a plurality of amplifier modules, each receiving and amplifying an input signal from one microphone unit to generate a plurality of amplified signals; and a compensation module, receiving a plurality of adjusted gains from a plurality of automatic gain control (AGC) units corresponding to the amplifier modules, obtaining a gain difference between the adjusted gains, and adjusting one amplified signal according to the gain difference to obtain a compensated signal.

2. The audio processing apparatus as claimed in claim 1, wherein the compensation module suppresses the amplified signal corresponding to one of the microphone units according to the gain difference.

3. The audio processing apparatus as claimed in claim 1, wherein the amplifier modules comprise:

a plurality of programmable gain amplifiers (PGAs), each receiving the input signal from one corresponding microphone unit, and amplifying the input signal; and the plurality of automatic gain control (AGC) units, each coupled to one corresponding PGA and adjusting a gain of the corresponding PGA when an amplitude of the corresponding amplified signal is clipped to obtain the adjusted gain.

4. The audio processing apparatus as claimed in claim 3, wherein the compensation module comprises:

a plurality of compensation units, each receiving the amplified signal from one corresponding PGA, and adjusting the amplified signal according to the gain difference; and a control unit, detecting the gain difference between the adjusted gains and passing the gain difference to one of the compensation units to adjust the amplified signal amplified by one PGA.

5. The audio processing apparatus as claimed in claim 3, wherein the compensation module comprises:

a control unit, detecting and passing the gain difference to one corresponding AGC to further adjust the gain of one corresponding PGA by the gain difference.

6. The audio processing apparatus as claimed in claim 1, further comprising a microphone array signal processing module, processing the compensated signals to obtain a target signal.

7. The audio processing apparatus as claimed in claim 6, further comprising a reverse compensation module reversely adjusting the target signal according to the gain difference to generate an output signal.

8. An audio processing apparatus, comprising:

a first microphone unit;

a first programmable gain amplifier (PGA), receiving a first input signal picked up by the first microphone unit and amplifying the first input signal to generate a first amplified signal;

a first automatic gain control (AGC) unit, coupled to the first PGA and adjusting a first gain of the first PGA when an amplitude of the first amplified signal is clipped;

a second microphone unit;

a second PGA, receiving a second input signal picked up by the second microphone unit and amplifying the second input signal to generate a second amplified signal;

a second AGC unit, coupled to the second PGA and adjusting a second gain of the second PGA when an amplitude of the second amplified signal is clipped; and a compensation module, coupled to the first and second AGC units, receiving the first and second adjusted gains from the first and second AGC units, obtaining a gain difference between the first and second adjusted gains, and suppressing one of the first and the second input signals or amplified signals in response to the gain difference to obtain a first compensated signal or a second compensated signal.

9. The audio processing apparatus as claimed in claim 8, wherein when the first adjusted gain is greater than the second adjusted gain, the compensation module suppresses the first input or amplified signal by the gain difference.

10. The audio processing apparatus as claimed in claim 8, wherein when the second adjusted gain is greater than the first adjusted gain, the compensation module suppresses the second input or amplified signal by the gain difference.

11. The audio processing apparatus as claimed in claim 8, wherein the first microphone unit is arranged as a main microphone and the second microphone unit is arranged as a supplementary microphone to pick up signals from different directions.

12. The audio processing apparatus as claimed in claim 8, wherein the compensation module comprises:

a first compensation unit, coupled to the first PGA and adjusting the first amplified signal according to a first control signal;

a second compensation unit, coupled to the second PGA and adjusting the second amplified signal according to a second control signal; and a control unit detecting the gain difference and passing the gain difference to the first or second compensation unit as the first or second control signal.

13. The audio processing apparatus as claimed in claim 12, wherein the control unit subtracts a value of the first adjusted gain from a value of the second adjusted gain to obtain the gain difference, and generates the first control signal so as to instruct the first compensation unit to suppress the first input or amplified signal by the gain difference when the gain difference is a negative value.

14. The audio processing apparatus as claimed in claim 12, wherein the control unit subtracts a value of the first adjusted gain from a value of the second adjusted gain to obtain the gain difference, and generates the second control signal so as to instruct the second compensation unit to suppress the second input or amplified signal by the gain difference when the gain difference is a positive value.

15. The audio processing apparatus as claimed in claim 8, wherein the compensation module comprises:

a control unit, detecting and passing the gain difference to the first AGC unit to further adjust the first gain of the first PGA by the gain difference, or the second AGC unit to further adjust the second gain of the second PGA by the gain difference.

16. The audio processing apparatus as claimed in claim 15, wherein the control unit subtracts a value of the first adjusted gain from a value of the second adjusted gain to obtain the gain difference, and generates a first control signal corresponding to the gain difference so as to instruct the first AGC unit to further suppress the first gain by the gain difference when the gain difference is a negative value.

17. The audio processing apparatus as claimed in claim 15, wherein the control unit subtracts a value of the first adjusted gain from a value of the second adjusted gain to obtain the gain difference, and generates a second control signal corresponding to the gain difference so as to instruct the second AGC unit to further suppress the second gain by the gain difference when the gain difference is a positive value.

18. The audio processing apparatus as claimed in claim 8, further comprising:

a microphone array signal processing module, coupled to the compensation module, and processing the first and the second compensated signals to obtain a target signal; and a reverse compensation module amplifying the target signal according to the gain difference to generate an output signal.

19. An audio processing method, comprising:

obtaining a gain difference between a first adjusted gain generated by a first automatic gain control (AGC) unit and a second adjusted gain generated by a second AGC unit, wherein the first AGC is arranged to adjust gain of a first programmable gain amplifier (PGA) amplifying signals picked up by a first microphone, and the second AGC is arranged to adjust gain of a second PGA amplifying signals picked up by a second microphone;

suppressing a first signal originally generated by the first microphone by the gain difference when the first adjusted gain is greater than the second adjusted gain; and suppressing a second signal originally generated by the second microphone by the gain difference when the first adjusted gain is not greater than the second adjusted gain.

20. The method as claimed in claim 19, wherein a first compensation unit is coupled subsequently to the first PGA, a second compensation unit is coupled subsequently to the second PGA, the step of suppression of the first signal comprises suppressing the first signal output from the first PGA by the gain difference via the first compensation unit, and the step of suppression of the second signal comprises suppressing the second signal output from the second PGA by the gain difference via the second compensation unit.

21. The method as claimed in claim 19, wherein the step of suppression of the first signal comprises suppressing the first signal by the gain difference via the first AGC, and the step of suppression of the second signal comprises suppressing the second signal by the gain difference via the second AGC.

* * * * *